United States Patent [19]

Sato

[11] Patent Number: 5,522,935

[45] Date of Patent: Jun. 4, 1996

[54] PLASMA CVD APPARATUS FOR MANUFACTURING A SEMICONDUCTOR DEVICE

[75] Inventor: Akira Sato, Yamagata, Japan

[73] Assignee: NEC Corporation, Tokyo, Japan

[21] Appl. No.: 24,226

[22] Filed: Mar. 1, 1993

[30] Foreign Application Priority Data

Feb. 28, 1992 [JP] Japan ..................................... 4-98986

[51] Int. Cl.[6] .................................................. C23C 16/00
[52] U.S. Cl. .............................. 118/723 MP; 118/723 E; 118/715; 118/722
[58] Field of Search ........................... 437/225; 427/572; 118/715, 723 E, 723 MP, 722; 156/345; 204/298.07, 298.33

[56] References Cited

U.S. PATENT DOCUMENTS

| Re. 30,244 | 1/1980 | Alexander | 118/723 |
|---|---|---|---|
| 3,757,733 | 9/1973 | Reinberg | 118/49.5 |
| 4,513,021 | 4/1985 | Purdes | 427/38 |
| 4,664,938 | 5/1987 | Walker | 118/723 MP X |
| 4,811,684 | 3/1989 | Tashiro et al. | 118/723 MP X |
| 4,919,077 | 4/1990 | Oda et al. | 118/723 MP-X |
| 4,989,544 | 2/1991 | Yoshikawa | 118/722 X |
| 5,110,437 | 5/1992 | Yamada | 204/298.33 |

FOREIGN PATENT DOCUMENTS

| 0490883 | 6/1992 | European Pat. Off. | 118/722 |
|---|---|---|---|
| 0162776 | 8/1985 | Japan | 427/572 |
| 61-131419 | 6/1986 | Japan | 118/722 |
| 0081022 | 4/1987 | Japan | 118/723 MP |
| 63-14873 | 1/1988 | Japan | 118/722 |
| 63-67727 | 3/1988 | Japan . | |
| 63-69977 | 3/1988 | Japan . | |
| 63-307279 | 12/1988 | Japan . | |
| 0299324 | 12/1988 | Japan | 427/572 |
| 5-24976 | 2/1993 | Japan | 118/723 MP |

OTHER PUBLICATIONS

Sze, VLSI Technology, p. 237, McGraw–Hill, 1988.
Hinson, "The Basics of Plasmas", *The Book of Basics*, Materials Research Corp., pp. 1–4.
Webster's New World Dictionary, Simon and Schuster, 1988, p. KK19.

*Primary Examiner*—R. Bruce Breneman
*Assistant Examiner*—Joni Y. Chang
*Attorney, Agent, or Firm*—Sughrue, Mion, Zinn, Macpeak & Seas

[57] ABSTRACT

A plasma CVD apparatus comprises a housing for defining a reaction chamber, a semiconductor wafer holder and lower electrode located within the housing and configured to hold and support a semiconductor wafer thereon. The semiconductor wafer holder and lower electrode is connected to a common ground terminal. An upper electrode is located within the housing and connected to a radio frequency voltage supply. The an upper electrode is positioned separately from but opposite to the semiconductor wafer holder and lower electrode, so that the radio frequency voltage causes a plasma region on a deposition surface of the semiconductor wafer held by semiconductor wafer holder and lower electrode. An ultraviolet lamp is located to irradiate an ultraviolet ray on the deposition surface of the semiconductor wafer held by the semiconductor wafer holder and lower electrode.

5 Claims, 2 Drawing Sheets

PLASMA CVD APPARATUS FOR MANUFACTURING A SEMICONDUCTOR DEVICE

BACKGROUND OF THE INVENTION

1. Field of the Invention

The present invention relates to an apparatus for manufacturing a semiconductor device, and more specifically to a plasma CVD (chemical vapor deposition) apparatus for manufacturing a semiconductor device.

2. Description of Related Art

Conventional plasma CVD apparatuses have been fundamentally so constituted that a semiconductor wafer is located and supported on a semiconductor wafer holder and lower electrode connected to a common ground terminal, and an upper electrode connected to a RF (radio frequency) voltage supply is located separately from the semiconductor wafer but opposite to the semiconductor wafer. The RF voltage causes a plasma discharge between the lower and upper electrodes, so that a plasma region is created on a surface of the semiconductor wafer. In this condition, a reacting gas is introduced to the plasma region, so that the reacting gas is ionized, and a film is deposited or grown the semiconductor wafer. In this manner, the semiconductor wafer is used as a semiconductor substrate in a process of manufacturing a semiconductor device, and various necessary films can be deposited on the semiconductor substrate.

In the above mentioned plasma CVD process, electric charges created by the plasma am accumulated in a deposited film, and therefore, characteristics of a finished semiconductor device are influenced by the electric charges accumulated in the deposited film. In other words, the characteristics of the finished semiconductor device have often deviated from expected characteristics.

SUMMARY OF THE INVENTION

Accordingly, it is an object of the present invention to provide a plasma CVD apparatus which has overcome the above mentioned defect of the conventional one.

Another object of the present invention is to provide a plasma CVD apparatus capable of preventing electric charges from being accumulated in a deposited film, so that a finished semiconductor device has expected characteristics without being influenced by the electric charges which would have been otherwise accumulated in the deposited film.

The above and other objects of the present invention are achieved in accordance with the present invention by a plasma CVD apparatus comprising a housing for defining a reaction chamber, a semiconductor wafer holder and lower electrode located within the housing and configured to hold and support a semiconductor wafer thereon, the semiconductor wafer holder and lower electrode being connected to a common ground terminal, and an upper electrode located within the housing and connected to a radio frequency voltage supply, the an upper electrode being positioned separately from but opposite to the semiconductor wafer holder and lower electrode, so that the radio frequency voltage creates a plasma region on a deposition surface of the semiconductor wafer held by semiconductor wafer holder and lower electrode, and an ultraviolet lamp located to irradiate an ultraviolet ray on the deposition surface of the semiconductor wafer held by the semiconductor wafer holder and lower electrode.

Preferably, the ultraviolet ray is irradiated at a dosage of not less than 300 mW/cm$^2$ for a period of at least two minutes, in order to substantially cancel the electric charge accumulated in the deposited film.

The above and other objects, features and advantages of the present invention will be apparent from the following description of preferred embodiments of the invention with reference to the accompanying drawings.

DESCRIPTION OF THE PREFERRED EMBODIMENTS

Figure 1:
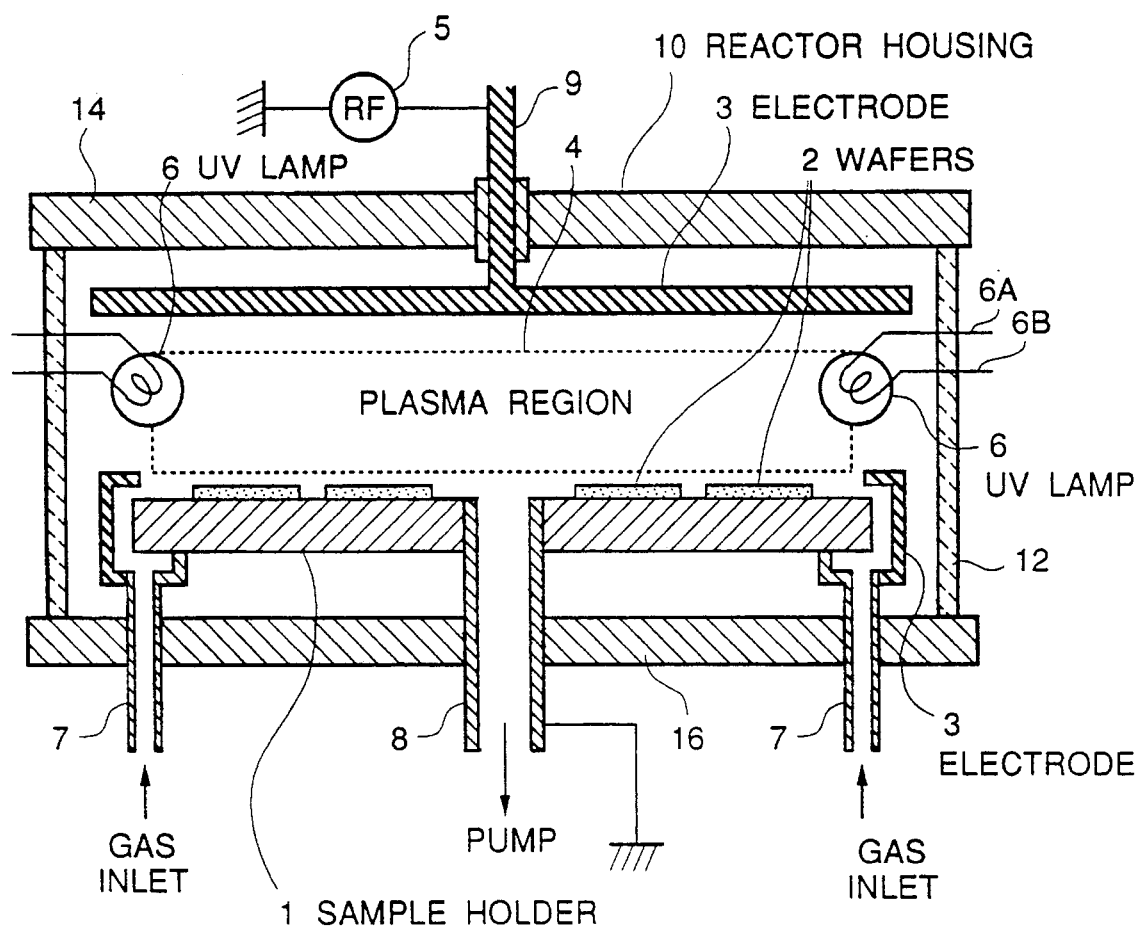
FIG. 1 is a diagrammatic section view of an embodiment of the plasma CVD apparatus in accordance with the present invention.

Referring to FIG. 1, there is shown a diagrammatic section view of an embodiment of the plasma CVD apparatus in accordance with the present invention.

The shown plasma CVD apparatus is a parallel-plate plasma CVD reactor, and includes a reactor housing 10, which is composed of glass cylinder 12 sealed with upper and lower metallic endplates 14 and 16. With a reaction chamber defined by the reactor housing 10, a sample holder and lower electrode 1 is located and supported by a support and outlet metallic pipe 8, which has its upper end connected to and passing through a center portion of the sample holder and lower electrode 1 and its lower end hermetically passing through the lower endplate 16. The pipe 8 is connected to a common ground terminal, and coupled to a pump (not shown) for exhausting the reaction chamber. In addition, reacting gas inlet pipes 7 are provided to hermetically pass through the lower endplate 16 so as to supply a reaction gas from a periphery of the sample holder and lower electrode 1. Semiconductor wafers 2 are located and supported on the sample holder and lower electrode 1.

An upper electrode 3 is located separately from but opposite to the sample holder and lower electrode 1, so that a reaction space or plasma region 4 is formed between the upper electrode 3 and the sample holder and lower electrode 1. The upper electrode 3 is connected to an input conductor 9 which hermetically passes through the upper endplate 14 but is insulated from the upper endplate 14. The input conductor 9 is connected to a radio frequency voltage supply 5.

In addition, ultraviolet lamps 6 are located within the reactor housing 10, preferably in a space between the upper electrode and the semiconductor wafer holder and lower electrode, so as to irradiate an ultraviolet ray on the deposition surface of the semiconductor wafers held by the sample holder and lower electrode 1. Lead conductors 6A and 6B of each of the ultraviolet lamps 6 are drawn out to hermetically pass through the glass cylinder 12 as diagrammatically shown in the drawing or through the upper endplate 14 or the lower end plate 16.

The above mentioned plasma CVD apparatus can be used as follows:

In the condition in which the semiconductor wafers 2 are located and supported on the sample holder and lower electrode 1, a radio frequency voltage is applied to the upper electrode 3 from the RF voltage supply 5, so that the plasma region 4 is created between between the upper electrode 3 and the sample holder and lower electrode 1, namely on the semiconductor wafers 2 supported by the sample holder and lower electrode 1. By introducing a reaction gas from the inlet pipes 7 into the reactor housing 10 and by exhausting from the outlet pipe 8, the reaction gas is ionized within the plasma region 4, and a film is gradually deposited on the semiconductor wafers 2. In this process that the film is being gradually deposited on the semiconductor wafers 2, the ultraviolet lamps 6 are energized to irradiate an ultraviolet my on the deposition surface of the semiconductor wafers. In this process, the ultraviolet lamps 6 are energized to irradiate the ultraviolet ray at a dosage of not less than 300 mW/cm$^2$ for a period of at least two minutes.

In this process, the electric charge accumulated in the deposited film was almost zero (0) volt as the result of the ultraviolet irradiation. On the other hand, when ultraviolet was not irradiated, the electric charge accumulated in the deposited film reached about several tens volts.

The above mentioned plasma CVD apparatus can be used in another method as follows:

In the condition in which the semiconductor wafers 2 are located and supported on the sample holder and lower electrode 1, a radio frequency voltage is applied to the upper electrode 3 from the RF voltage supply 5, so that the plasma region 4 is created between between the upper electrode 3 and the sample holder and lower electrode 1. By introducing a reaction gas from the inlet pipes 7 into the reactor housing 10 and by exhausting from the outlet pipe 8, the reaction gas is ionized within the plasma region 4, and a film is gradually deposited on the semiconductor wafers 2. When the deposited film reaches a desired thickness, the introduction of the reaction gas is stopped, so that the deposition process is completed. Thereafter, the ultraviolet lamps 6 are energized to irradiate an ultraviolet my on the deposition surface of the semiconductor wafers. In this second method, an advantage similar to that of the first method could be obtained.

Figure 2:
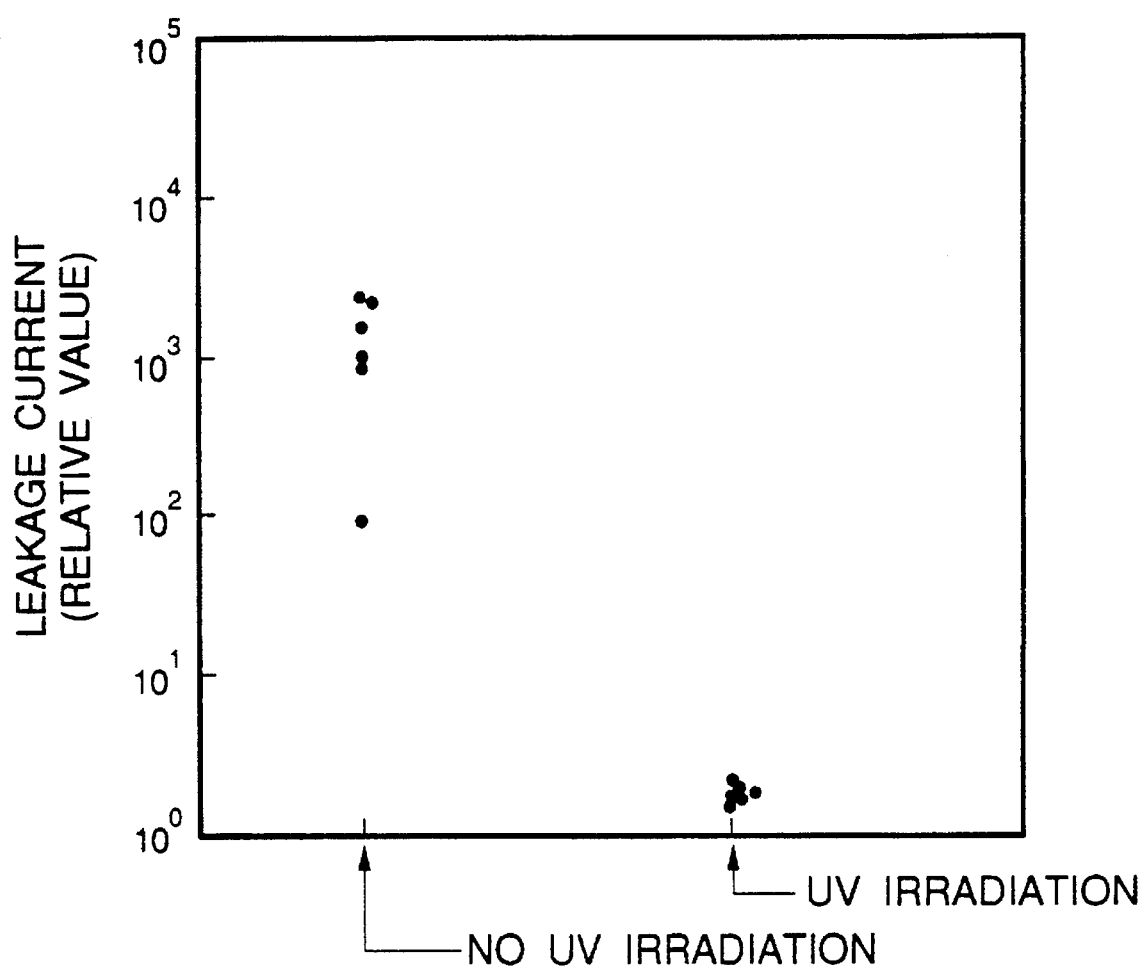
FIG. 2 is a graph illustrating a leakage current of samples subjected to the ultraviolet irradiation or no ultraviolet irradiation in the course of the plasma CVD process.

Referring to FIG. 2, there is shown a graph illustrating a leakage current of samples of finished devices, one half of which were subjected to the ultraviolet irradiation in the course of the plasma CVD process or after the plasma CVD process, and the other half of which were subjected to no ultraviolet irradiation in the course of the plasma CVD process or after the plasma CVD process. It would be understood that, the finished devices, which were subjected to the ultraviolet irradiation in the course of the plasma CVD process or after the plasma CVD process, have only a minimized or extremely improved leakage current.

In the above mentioned two methods, ions created by the plasma are entrapped in the deposited film and accumulated in the form of electric charges. However, if ultraviolet is irradiated onto the semiconductor wafer in the course of the film deposition or after the film deposition process, photons of the ultraviolet give an energy to electrons in the semiconductor wafer, so as to excite the electrons. The excited electrons act on the electric charges accumulated in the deposited film. Namely, if the electric charges accumulated in the deposited film are positive electric charges, the positive electric charges are neutralized by the excited electrons. On the other hand, if the electric charges accumulated in the deposited film are negative electric charges, the negative electric charges flow together with the excited electrons through the semiconductor wafer to the common ground terminal, so that the negative electric charges disappear from the semiconductor wafer.

The invention has thus been shown and described with reference to the specific embodiments. However, it should be noted that the present invention is in no way limited to the details of the illustrated structures but changes and modifications may be made within the scope of the appended claims.

I claim:

1. A plasma CVD apparatus comprising:

a housing for defining a reaction chamber, a lower electrode located within said housing and configured to hold and support a semiconductor wafer thereon, said lower electrode being connected to a common ground terminal, an upper electrode located within said housing and connected to a radio frequency voltage supply, said an upper electrode being positioned separately from but opposite to the lower electrode, so that the radio frequency voltage creates a plasma region above a deposition surface of the semiconductor wafer held by said lower electrode, and an ultraviolet lamp located in a space between said upper electrode and said lower electrode to irradiate an ultraviolet ray on said deposition surface of the semiconductor wafer held by said lower electrode.

2. A plasma CVD apparatus comprising:

a housing for defining a reaction chamber, means for supporting a semiconductor wafer within said reaction chamber, means for generating a plasma in said reaction gas above said semiconductor wafer so that a film is deposited on said semiconductor wafer by a plasma CVD process, and means, disposed in a space between said upper electrode and said lower electrode, for irradiating an ultraviolet ray on said semiconductor wafer.

3. A plasma CVD apparatus claimed in claim 2 wherein said plasma generating means includes a lower electrode located within said housing and configured to hold and support said semiconductor wafer thereon, said lower electrode being connected to a common ground terminal, and an upper electrode located within said housing and connected to a radio frequency voltage supply, said an upper electrode being positioned separately from but opposite to the and lower electrode, so that the radio frequency voltage causes a plasma region on said semiconductor wafer held by said lower electrode.

4. A plasma CVD apparatus as claimed in claim 1, further comprising:

a plurality of inlet pipes, disposed adjacent to said lower electrode, which introduce a reaction gas into said reaction chamber; and an exhaust pump opening, disposed in said lower electrode, which removes said reaction gas from said reaction chamber.

5. A plasma CVD apparatus as claimed in claim 2, further comprising:

means, adjacent said supporting means, for introducing a reaction gas into said reaction chamber; and means, having an opening in said supporting means, for removing said reaction gas from said chamber.

\* \* \* \* \*